US009666573B1

(12) United States Patent
Sukekawa

(10) Patent No.: US 9,666,573 B1
(45) Date of Patent: May 30, 2017

(54) METHODS OF FORMING INTEGRATED CIRCUITRY

(71) Applicant: Micron Technology, Inc., Boise, ID (US)

(72) Inventor: Mitsunari Sukekawa, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/335,259

(22) Filed: Oct. 26, 2016

(51) Int. Cl.
*H01L 21/00* (2006.01)
*H01L 25/00* (2006.01)
(Continued)

(52) U.S. Cl.
CPC ........ *H01L 25/50* (2013.01); *H01L 21/76898* (2013.01); *H01L 24/03* (2013.01); *H01L 24/05* (2013.01); *H01L 24/08* (2013.01); *H01L 24/29* (2013.01); *H01L 24/32* (2013.01); *H01L 24/73* (2013.01); *H01L 24/80* (2013.01); *H01L 24/83* (2013.01); *H01L 24/92* (2013.01); *H01L 25/0657* (2013.01); *H01L 2224/0311* (2013.01); *H01L 2224/05006* (2013.01); *H01L 2224/0557* (2013.01); *H01L 2224/05546* (2013.01); *H01L 2224/05558* (2013.01); *H01L 2224/05647* (2013.01); *H01L 2224/08146* (2013.01); *H01L 2224/29034* (2013.01); *H01L 2224/29187* (2013.01); *H01L 2224/32145* (2013.01); *H01L 2224/73104* (2013.01); *H01L 2224/73204* (2013.01); *H01L 2224/80203* (2013.01);
(Continued)

(58) Field of Classification Search
CPC .......... H01L 24/03; H01L 24/05; H01L 24/08
See application file for complete search history.

(56) References Cited

U.S. PATENT DOCUMENTS 7,385,283 B2    6/2008  Wu et al.
8,461,017 B2 *  6/2013  Sadaka ............... H01L 21/2007
                                                257/E21.211
(Continued)

OTHER PUBLICATIONS

Radu et al., "Recent developments of Cu-Cu non-thermo compression bonding for wafer-to-wafer 3D stacking," 3D Systems Integration Conference (3DIC), 2010 IEEE International, Nov. 16-18, 2010, pp. 1-6.
(Continued)

*Primary Examiner* — Richard Booth
(74) *Attorney, Agent, or Firm* — Wells St. John P.S.

(57) ABSTRACT

Some embodiments include a method of forming integrated circuitry. A first assembly is formed to have a first dielectric material, a first conductive pad and a conductive structure. The first assembly has a first surface which includes a surface of the first dielectric material, a surface of the first conductive pad and a surface of the conductive structure. A second assembly is formed to have a second dielectric material and a second conductive pad. The second assembly has a second surface which includes a surface of the second dielectric material and a surface of the second conductive pad. The first surface is placed directly against the second surface. The surface of the first dielectric material is bonded with the surface of the second dielectric material, and the surface of the first conductive pad is bonded with the surface of the second conductive pad.

21 Claims, 12 Drawing Sheets

(51) Int. Cl.
*H01L 23/00* (2006.01)
*H01L 21/768* (2006.01)
*H01L 25/065* (2006.01)

(52) U.S. Cl.
CPC ............ *H01L 2224/80815* (2013.01); *H01L 2224/83048* (2013.01); *H01L 2224/83236* (2013.01); *H01L 2224/83896* (2013.01); *H01L 2224/92142* (2013.01); *H01L 2225/06527* (2013.01); *H01L 2225/06541* (2013.01); *H01L 2924/20105* (2013.01); *H01L 2924/20108* (2013.01); *H01L 2924/20109* (2013.01)

(56) References Cited

U.S. PATENT DOCUMENTS

| | | | |
|---|---|---|---|
| 9,087,821 B2 | 7/2015 | Lin | |
| 9,147,650 B2 | 9/2015 | Hagimoto et al. | |
| 9,230,941 B2 | 1/2016 | Chen et al. | |
| 9,257,399 B2 | 2/2016 | Kuang et al. | |
| 9,461,007 B2 * | 10/2016 | Chun | H01L 23/3192 |
| 9,502,345 B2 * | 11/2016 | Gundel | H01L 23/50 |

OTHER PUBLICATIONS

Teh et al., "Post-Bond Sub-500 nm Alignment in 300 mm Integrated Face-to-Face Wafer-to-Wafer Cu-Cu Thermocompression, Si-Si Fusion and Oxide-Oxide Fusion Bonding," 3D Systems Integration Conference (3DIC), 2010 IEEE International, Nov. 16-18, 2010, pp. 1-6.

Tezzaron Semiconductor Corporation, "Tezzaron Announces World's First Eight-Layer Active Wafer Stack", press release, Aug. 31, 2015. Downloaded Sep. 12, 2016 from http://tezzaron.com/tezzaron-announces-worlds-first-eight-layer-active-wafer-stack/.

Liu et al., "Low-temperature direct copper-to-copper bonding enabled by creep on (111) surfaces of nanotwinned Cu", Nature Scientific Reports, Published May 12, 2015, pp. 1-11.

* cited by examiner

METHODS OF FORMING INTEGRATED CIRCUITRY

TECHNICAL FIELD

Methods of forming integrated circuitry utilizing wafer level bonding technologies.

BACKGROUND

Three-dimensional integration may enable fabrication of highly integrated circuitry through vertical stacking of various materials and functional components. Three-dimensional integration shows promise as methodology for developing integrated structures having higher performance, higher density, higher functionality, smaller form factor, and possible cost reductions, as compared to other technologies. However, three-dimensional integration is an emerging field, and in many instances presents challenges which will need to be addressed before this becomes a viable manufacturing path.

Wafer bonding is a methodology which may have application relative to three-dimensional integration. For instance, wafer bonding may be utilized for fabrication of silicon-on-insulator (SOI) constructions, CMOS image sensors, etc.

Wafer bonding comprises the bonding of two semiconductor assemblies to one another to form a composite structure. One method of wafer bonding comprises formation of silicon dioxide surfaces across each of the assemblies which are to be bonded to another. The silicon dioxide surfaces are then placed against one another, and subjected to appropriate treatment to induce covalent bonding between the surfaces and thereby form the composite structure. The treatment utilized to induce the covalent bonding may be a thermal treatment. In some aspects, such thermal treatment may utilize a temperature in excess of 800° C. Alternatively, one or both of the silicon dioxide surfaces may be subjected to a plasma treatment prior to the thermal treatment, and in such aspects the temperature of the thermal treatment may be reduced to a temperature within a range of from about 150° C. to about 200° C. The bonding of the silicon dioxide surfaces to one another may be referred to as "hybrid bonding".

Another technique which may be utilized during wafer bonding is to bond metal-containing materials to one another through so-called thermo-compression bonding. The thermo-compression process may comprise clamping two semiconductor assemblies to one another such that a first metal-containing material along a surface of one of the assemblies is directly against a second metal-containing material along a surface of the other of the assemblies. Subsequently, pressure may be applied through the clamping mechanism, and a temperature within a range of from about 300° C. to about 400° C. may be applied to the metal-containing materials to induce fusion between the first and second metal-containing materials.

It would be desirable to develop new methods for wafer bonding.

BRIEF DESCRIPTION OF THE DRAWINGS

FIG. 1 shows various structures in three-dimensional view during a process of combining two assemblies into a composite structure.

FIG. 2 shows various structures in cross-sectional side view during a process of combining two assemblies into a composite structure.

FIG. 3 shows various structures in cross-sectional side view during a process of combining two assemblies into a composite structure.

FIG. 4 shows various structures in cross-sectional side view during a process of forming an assembly.

FIG. 5 shows the assembly of FIG. 4 incorporated into a composite structure.

DETAILED DESCRIPTION OF THE ILLUSTRATED EMBODIMENTS

In some embodiments, it is recognized that hybrid bonding technologies may be utilized in combination with thermo-compression technologies for bonding two semiconductor assemblies to another. The hybrid bonding technologies may be utilized for bonding silicon dioxide-containing surfaces (or other suitable surfaces) to one another, which may align metal-containing surfaces and also provide suitable pressure across the metal-containing surfaces for thermo-compression. The thermo-compression may occur subsequent to the hybrid bonding in some applications, and/or may occur simultaneously with at least some of the hybrid bonding in some applications. Example embodiments are described with reference to FIGS. 1-12.

Figure 1:
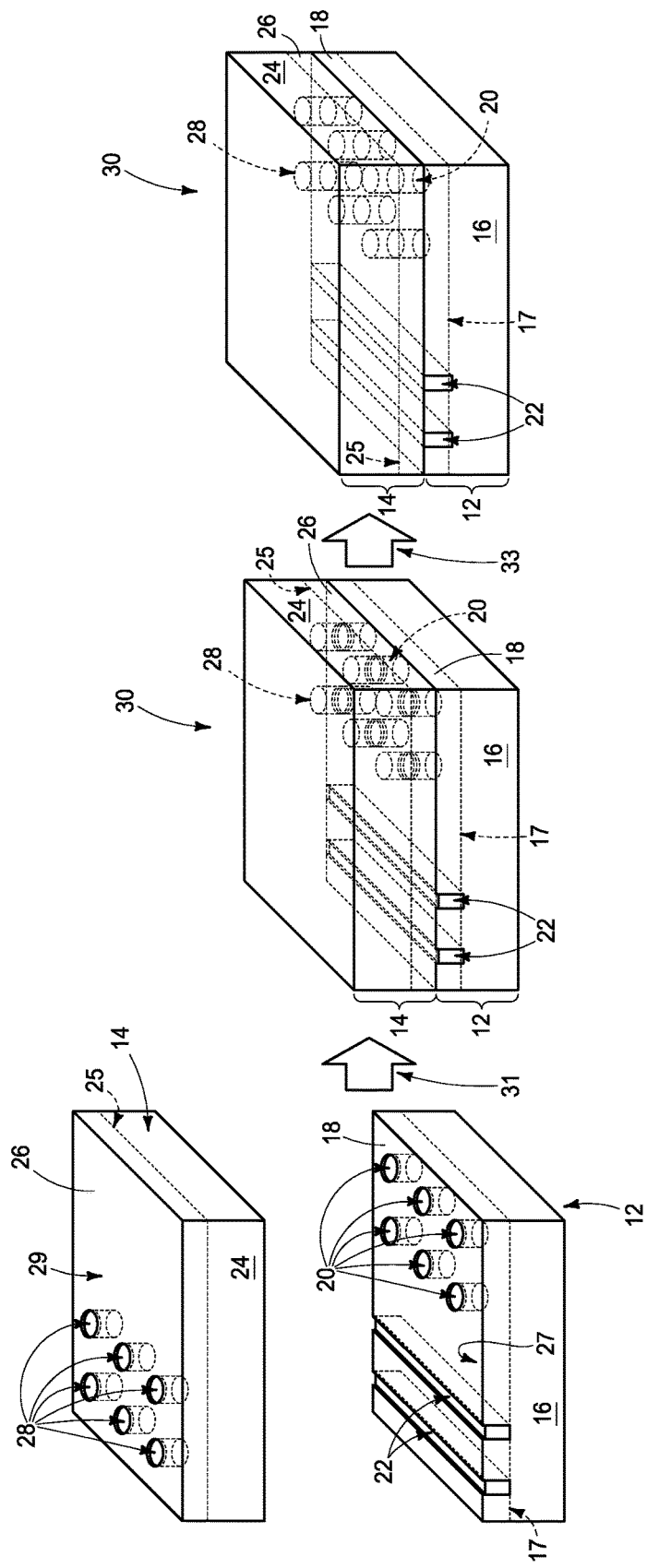
FIG. 1 is a diagrammatic view of example processing of an example method.

Referring to FIG. 1, an example process is diagrammatically illustrated as a flow from the left side of the figure to the right side.

The left side of the figure shows a pair of assemblies 12 and 14. The assembly 12 may be referred to as a first assembly, and comprises a first semiconductor substrate 16 (with an approximate location of an upper surface of the first semiconductor substrate 16 being diagrammatically illustrated with a dashed line 17). The semiconductor substrate 16 supports a first dielectric material 18, and a plurality of first conductive pads 20; with the first conductive pads 20 extending into the first dielectric material 18. Although a plurality of first conductive pads 20 are shown, in some embodiments the may be only a single first conductive pad 20 associated with the first assembly 12. The first conductive pads 20 may be referred to as first bonding pads, in that they are ultimately utilized during bonding of the first and second assemblies (12/14) to one another.

The first assembly 12 also includes a pair of conductive structures 22 which are spaced from the first conductive pads 20 by intervening regions of first dielectric material 18. In the illustrated embodiment, the conductive structures 22 are lines (for instance, wiring), and may be utilized for power supply lines, signal lines, interconnect lines, etc. In other embodiments, the conductive structures 22 may correspond to any other suitable circuitry. Although two conductive structures 22 are shown, in other embodiments there may be only a single conductive structure 22, or there may be more than two conductive structures 22. Further, although the conductive structures 22 are identical to one another, in other embodiments multiple different conductive structures may be associated with the first assembly, and spaced from the first conductive pads 20.

The assembly 14 may be referred to as a second assembly, and comprises a second semiconductor substrate 24 (with an approximate location of an upper surface of the second semiconductor substrate 24 being diagrammatically illustrated with a dashed line 25). The semiconductor substrate 24 supports a second dielectric material 26, and a plurality of second conductive pads 28; with the second conductive pads 28 extending into the dielectric material 26. Although a plurality of second conductive pads 28 are shown, in some embodiments the may be only a single second conductive pad 28 associated with the second assembly 14. The second conductive pads 28 may be referred to as second bonding pads.

The first assembly 12 has a first surface 27 that extends across surfaces of the first dielectric material 18, first conductive pads 20 and the conductive structures 22. In some embodiments, the first surface 27 may be substantially planar across all of the surfaces of dielectric material 18, conductive pads 20 and conductive structures 22 (with the term "substantially planar" meaning planar to within reasonable tolerances of fabrication and measurement). In such embodiments, the first conductive pads 20 and the first conductive structures 22 may have upper surfaces which are substantially coplanar with one another (with the term "substantially coplanar" meaning coplanar to within reasonable tolerances of fabrication and measurement).

The second assembly 14 has a second surface 29 that extends across surfaces of the second dielectric material 26 and the second conductive pads 28. In some embodiments, the second surface 29 may be substantially planar across all of the surfaces of the second dielectric material 26 and the second conductive pads 28.

Planarity across the first and second surfaces 27/29 may improve bonding of the first and second assemblies 12/14 to one another. Specifically, if surfaces 27/29 are not sufficiently planar, there may be undesired discontinuities (i.e., gaps) introduced along an interface of the first and second surfaces 27/29 during the bonding process.

The first and second semiconductor substrates 16 and 24 may comprise any suitable semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The first and second dielectric materials 18 and 26 may comprise any suitable compositions or combinations of compositions. In some embodiments, the first and second dielectric materials 18 and 26 will both comprise, consist essentially of, or consist of silicon dioxide.

The first and second conductive pads 20 and 28 may comprise any suitable electrically conductive compositions or combinations of electrically conductive compositions. The first and second conductive pads 20 and 28 may be a same composition as one another, or may comprise different compositions relative to one another. In some embodiments, the first and second conductive pads 20 and 28 may comprise metal. In some embodiments, the first and second conductive pads 20 and 28 may comprise, consist essentially of, or consist of copper.

The assemblies 12 and 14 may be fabricated utilizing any suitable methodology. For instance, the first assembly 12 may be fabricated by forming the first dielectric material 18 over the first semiconductor substrate 16. The first conductive pads 20 and conductive structures 22 may be formed before or after forming the first dielectric material 18, and regardless may be considered to be formed to be within the first dielectric material 18. Similarly, the second assembly 14 may be fabricated by forming the second dielectric material 26 over the second semiconductor substrate 24, and by forming the second conductive pads 28 to be within the second dielectric material 26.

The first and second surfaces 27 and 29 of the first and second assemblies 12 and 14 are placed directly against one another and subjected to appropriate hybrid-bonding processing 31 to form a composite structure 30. Surfaces of the first and second dielectric materials are directly against one another within the structure 30, and surfaces of the first conductive pads 20 are aligned with surfaces of the second conductive pads 28 within the structure 30. The conductive structures 22 are capped by the second dielectric material 24 within the structure 30, and are electrically isolated from the conductive pads 20 and 28.

Structure 30 may be referred to as a hybrid-bonding structure. In some embodiments, one or both of the first and second surfaces 27 and 29 may be plasma treated prior to placing the surfaces in contact with one another and forming the hybrid-bonding structure 30. The plasma treatment may comprise utilization of an $N_2$ or $O_2$ plasma generated with microwaves under a reduced-pressure atmosphere. After the plasma treatment, the thermal treatment suitable to achieve hybrid bonding may comprise utilization of a temperature within a range of from about 150° C. to about 200° C.

The composite structure 30 may be subjected to a thermal treatment (i.e., thermal anneal) 33 to induce bonding between conductive pads 20 and 28 and to strengthen an interface of the oxides of dielectric materials 18 and 26. The bonding between the conductive pads 20 and 28 may be achieved by using thermal conditions analogous to those utilized in thermo-compression methodology (and in some applications may utilize a temperature within a range of from about 200° C. to about 350° C. for a time of about 1 hour). However, in contrast to conventional thermo-compression methodology, the embodiment of FIG. 1 utilizes hybrid bonding of dielectric materials 18 and 26 to maintain alignment of the conductive pads 20 and 28, and to provide suitable compression across the pads 20 and 28 to achieve fusion of the conductive materials of pads 20 and 28. Accordingly, clamping and alignment procedures of prior art thermo-compression methodologies may be omitted.

Although the embodiment of FIG. 1 shows the thermal fusion of pads 20 and 28 (i.e., processing step 33) as a separate processing stage following the hybrid bonding of dielectric materials 18 and 26 (i.e., processing step 31), in other embodiments at least some of the fusion of pads 20 and 28 may occur during the hybrid-bonding process.

Figure 2:
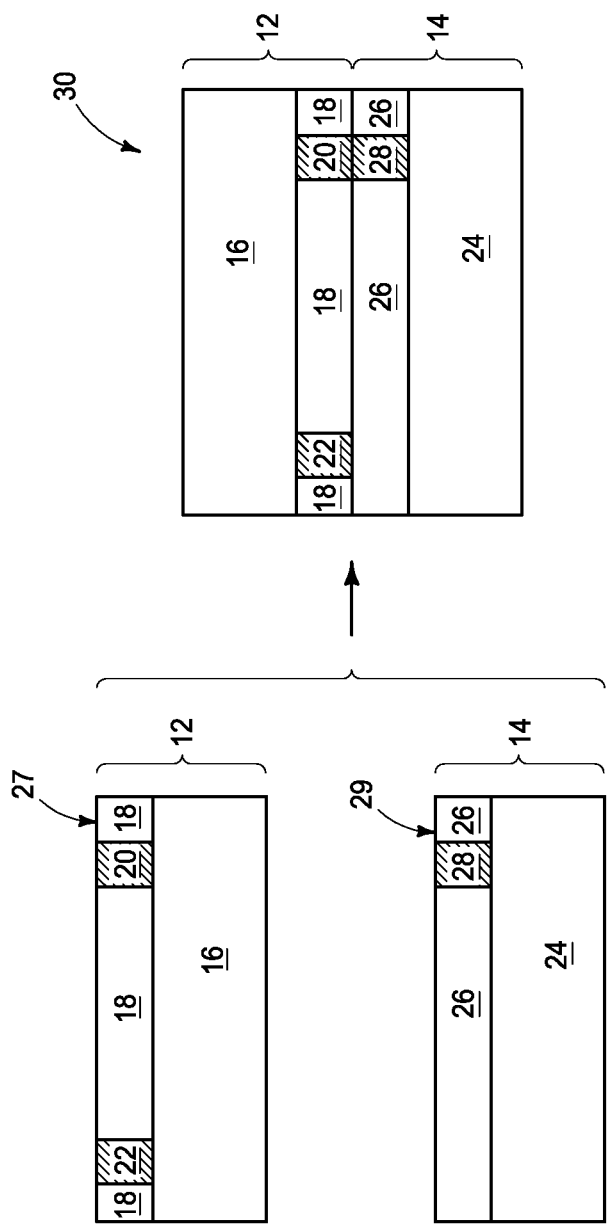
FIG. 2 is a diagrammatic view of example processing of an example method.

FIG. 2 diagrammatically illustrates an example process similar to that of FIG. 1, utilizing a different style of drawing. The first and the second assemblies 12 and 14 are shown in cross-sectional side view on a left side of FIG. 2. The first surface 27 of first assembly 12 is placed directly against the second surface 29 of second assembly 14, and then the assemblies 12 and 14 are bonded to another to form the composite structure (i.e., hybrid-bonding structure) 30 shown on the right side of FIG. 2. The bonding of the assemblies 12 and 14 comprises formation of covalent bonds between dielectric materials 18 and 26 (for instance, hybrid bonding between silicon dioxide-containing materials 18 and 26) in conjunction with fusion between conductive material of pads 20 and 28 (for instance, fusion between copper-containing material of pads 20 and 28).

FIG. 2 shows the first conductive pads 20 and the second conductive pads 28 comprising a homogeneous conductive material. In other embodiments, the conductive pads 20 and/or the conductive pads 28 may comprise two or more different conductive materials.

FIG. 2 shows conductive structure 22 comprising a single homogeneous conductive material. In other embodiments, conductive structure 22 may comprise two or more different materials. The conductive structure 22 may be a line extending in and out of the page relative to the cross-section of FIG. 2, or may be any other suitable conductive structure.

FIG. 2 shows dielectric materials 18 and 26 as homogeneous dielectric materials. In other embodiments, one or both of the other two materials 18 and 26 may comprise two or more different compositions.

Figure 3:
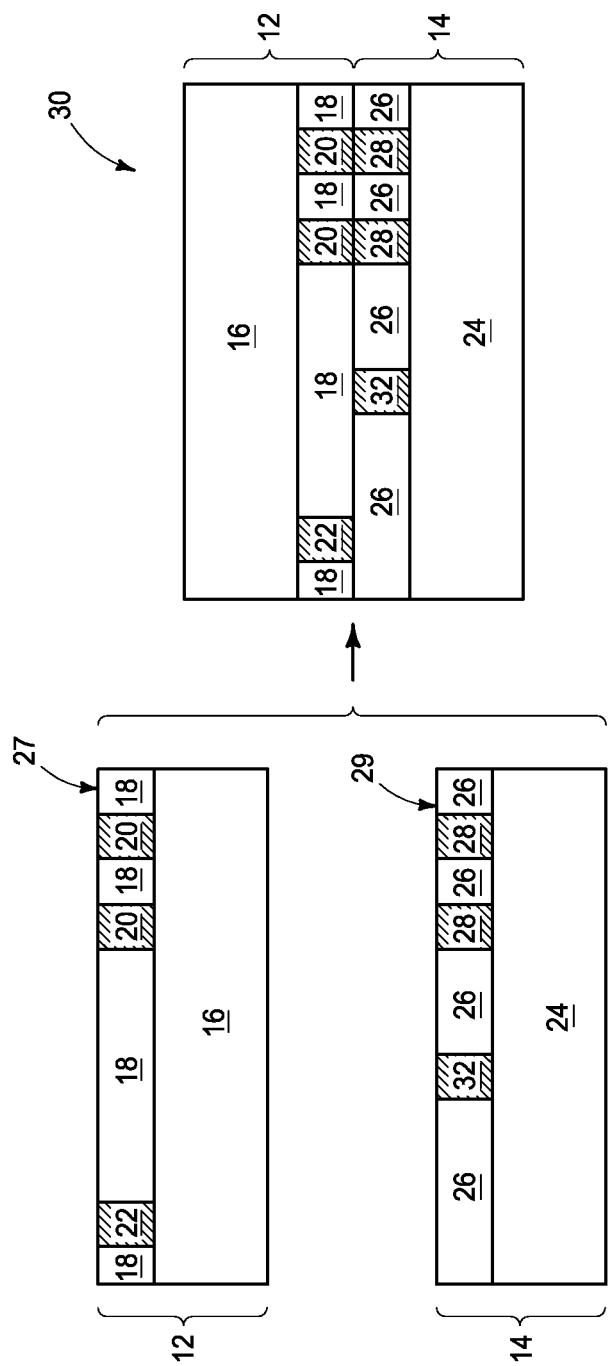
FIG. 3 is a diagrammatic view of example processing of an example method.

FIG. 3 diagrammatically illustrates another example embodiment. The first assembly 12 comprises a pair of the conductive pads 20, and the second assembly 14 comprises a pair of the conductive pads 28. The conductive structure 22 of the first assembly 12 is a first conductive structure, and the assembly 14 comprises a second conductive structure 32. The second conductive structure 32 may be any suitable conductive structure. In some embodiments, the first and second conductive structures 22 and 32 are lines extending in and out of the page relative to the cross-section of FIG. 3.

The first conductive structure 22 is spaced from the first conductive pads 20 by dielectric material 18, and similarly the second conductive structure 32 is spaced from second conductive pads 28 by dielectric material 26. Accordingly, the first conductive structure 22 is electrically isolated from conductive pads 20, and the second conductive structure 32 is electrically isolated from conductive pads 28. The first and second conductive structures 22 and 32 are example conductive structures. In some embodiments there may be more than one of the first conductive structures 22 and/or there may be more than one of the second conductive structures 32.

The assemblies 12 and 14 are bonded together to form the composite structure (i.e., hybrid-bonding structure) 30. The first conductive structure 22 within composite structure 30 is capped by second dielectric material 26; and the second conductive structure 32 within composite structure 30 is capped by the first dielectric material 18.

The conductive pads 20/28 and conductive structures 22/32 are shown to comprise single homogeneous conductive materials. In other embodiments, the conductive pads 20/28 and/or conductive structures 22/32 may comprise two or more different conductive materials. For instance, the conductive pads 20/28 and/or conductive structures 22/32 may be formed utilizing dual-damascene methodology as described with reference to FIG. 4.

Figure 4:
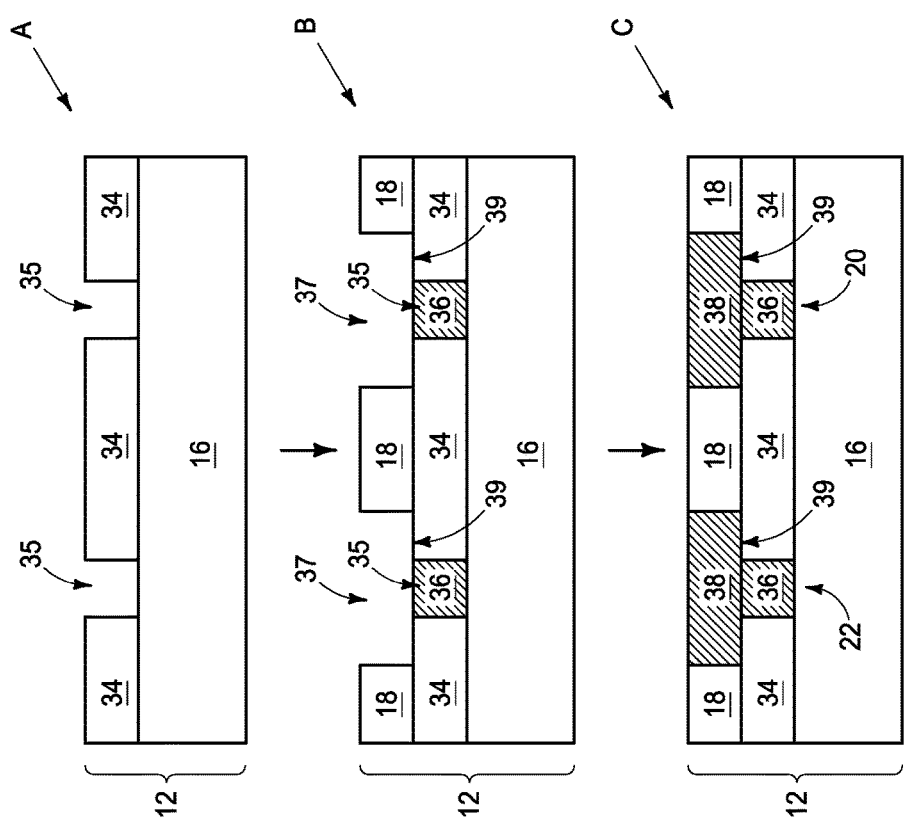
FIG. 4 is a diagrammatic view of example processing of an example method.

FIG. 4 shows the first assembly 12 at a processing stage "A" in which a patterned dielectric material 34 is formed across an upper surface of the first semiconductor substrate 16. The patterned dielectric material 34 has openings 35 extending therethrough. The dielectric material 34 may comprise any suitable composition or combination of compositions; including, for example, one or more of silicon dioxide, silicon nitride, aluminum oxide, hafnium oxide, etc.

A subsequent processing stage "B" shows metal-containing material 36 formed within openings 35 using a first damascene process, and shows the dielectric material 18 formed over the dielectric material 34. Openings 37 extend through the dielectric material 18 to expose the metal-containing material 36. The openings 37 are wider than the openings 35 along the cross-section of FIG. 4.

A subsequent processing stage "C" shows metal-containing material 38 formed within the second openings 37 utilizing a second damascene process. The second metal-containing material 38 may be a same composition as the first metal-containing material 36 or may be a different composition. The second metal-containing material 38 may, for example, comprise, consist essentially of, or consist of copper. The first metal-containing material 36 may, for example, comprise, consist essentially of, or consist of elemental metal (for instance, copper, aluminum, silver, platinum, palladium, tungsten, titanium, ruthenium, etc.) or substances having metal in combination with other elements (for instance, metal silicide, metal nitride, metal carbide, etc.).

The metal-containing materials 36 and 38 together form a conductive pad 20 and a conductive structure 22 spaced from the conductive pad 20. One aspect of utilizing the dual-damascene process is that the conductive pad 20 and conductive structure 22 may have stepped shapes. Specifically, upper regions (i.e., regions comprising material 38) of the conductive pad 20 and conductive structure 22 are wider than lower regions (i.e., regions comprising material 36) of the conductive pad 20 and conductive structure 22 along the cross-section of FIG. 4, with steps 39 corresponding to transitions between the upper regions and the lower regions.

Figure 5:
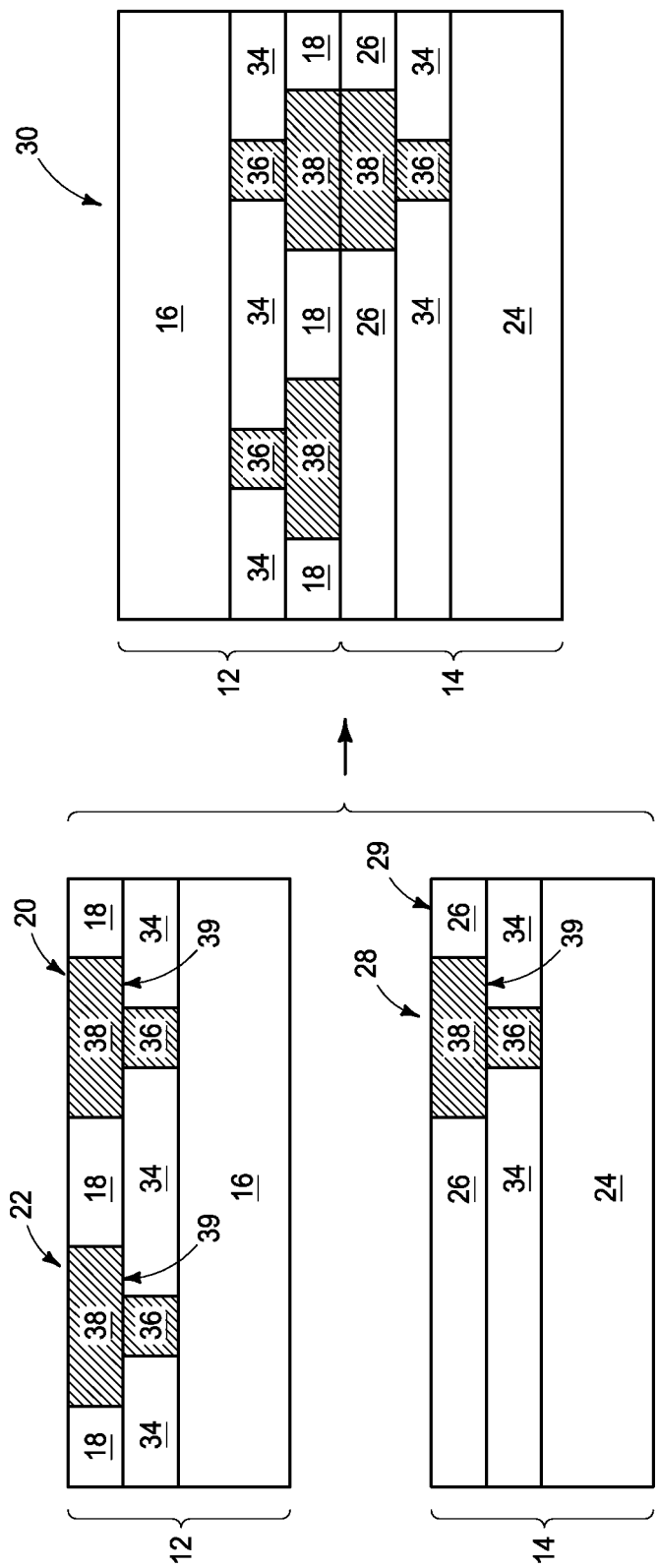
FIG. 5 is a diagrammatic view of example processing of an example method.

The assembly 12 may be incorporated into a composite structure 30 utilizing processing analogous to that described above with reference to FIGS. 1-3. For instance, FIG. 5 shows a process of forming a composite structure 30 from the assembly 12 from FIG. 4 in combination with an assembly 14 having a second conductive pad 28 formed utilizing a dual-damascene process analogous that described above with reference to FIG. 4. Although the second assembly 14 is shown having a conductive pad 28 formed utilizing a dual-damascene process, in other embodiments the second assembly 14 may comprise a conductive pad 28 analogous to the pad described above with reference to FIG. 2 (i.e., a pad lacking the stepped-shape associated with the illustrated dual-damascene processing). Also, although the second assembly 14 is shown comprising the same dielectric material 34 as is present in the first assembly 12, in other embodiments the second assembly 14 may comprise a different dielectric material in place of the dielectric material 34. Additionally, although the second conductive pad 28 comprises the same upper conductive material 38 and lower conductive material 36 as are utilized in the first conductive pad 20, in other embodiments at least one of the conductive materials within the second pad 28 may differ from the conductive materials of the first conductive pad 20. For instance, the lower conductive material of conductive pad 28 may comprise a different composition relative to the lower conductive material 36 of the first conductive pad 20.

The various assemblies (12/14) and composite structures (30) of FIGS. 1-5 are very generically illustrated. Such assemblies and composite structures may comprise any suitable circuitry which is desired to be incorporated into wafer-bonded three-dimensional integrated assemblies. FIGS. 6-12 illustrate some example circuitry in greater detail than is utilized in FIGS. 1-5.

Figure 6:
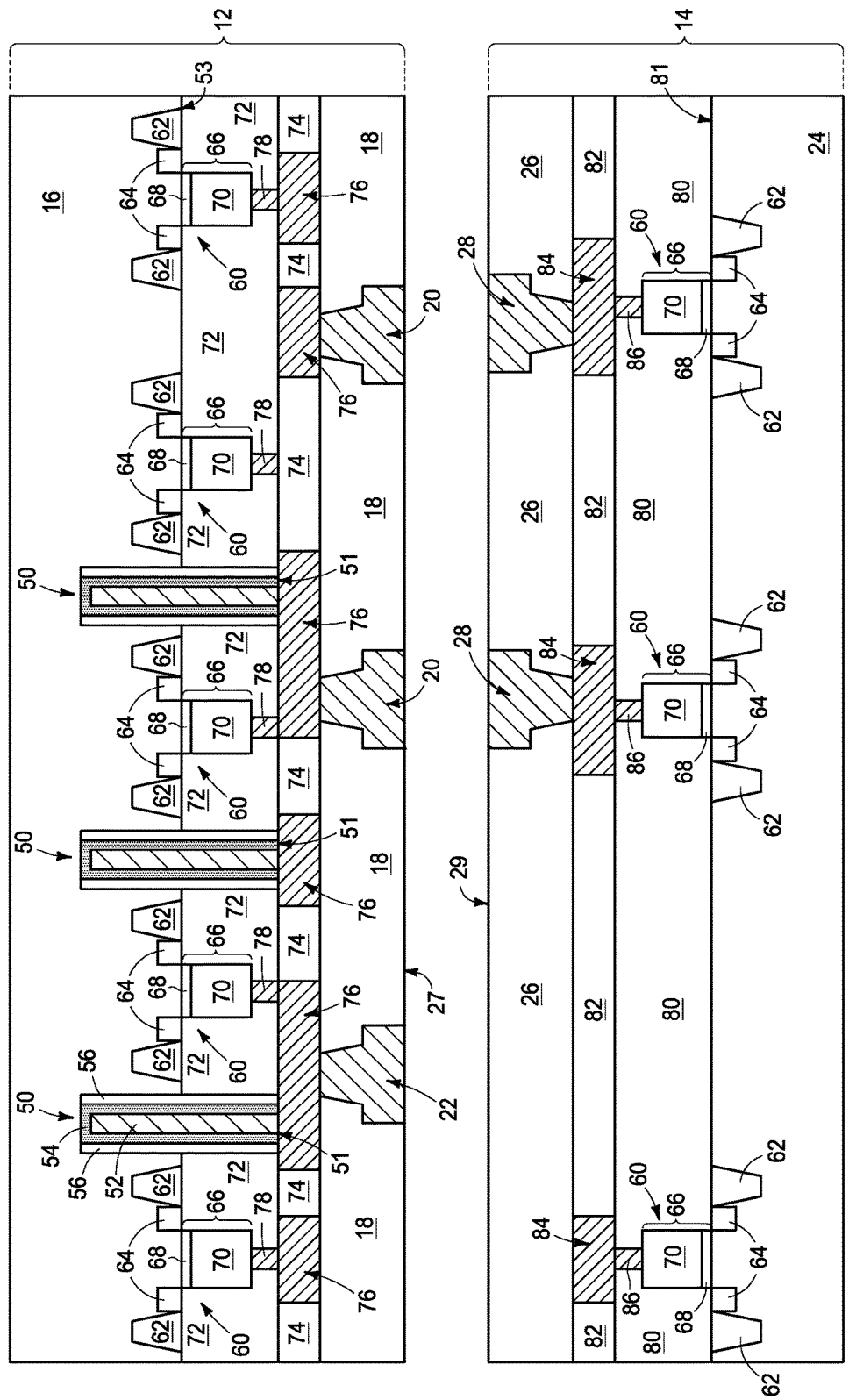
FIG. 6 shows two assemblies in cross-sectional side view.

Referring to FIG. 6, the first assembly 12 comprises the first semiconductor substrate 16, the first dielectric material 18, the first conductive pads 20, and the first conductive structure 22.

A plurality of through-wafer interconnects 50 extend into semiconductor material of semiconductor substrate 16. The through-wafer interconnects 50 comprise materials 52, 54 and 56 (labeled for only one of the through-wafer interconnects 50). The material 56 may be a dielectric material, such as, for example, silicon dioxide, silicon nitride, etc. The materials 52 and 54 may be conductive materials, and may comprise any suitable compositions or combinations of compositions. For instance, in some embodiments material 54 may comprise nickel on seed material such as titanium nitride or tungsten; copper on tungsten, copper on tantalum, etc.; and material 52 may comprise one or more of solder, copper, nickel, conductive polymers, etc.

Each of the through-wafer interconnects 50 has a first end 51 outward of a first side 53 of the semiconductor substrate 16. In some embodiments, the first dielectric material 18 may be considered to be formed outward of the first ends 51 of the through-wafer interconnects 50.

In the shown embodiment, a plurality of transistors 60 are supported by the first semiconductor substrate 16. Each of the transistors comprises a pair of heavily-doped source/drain regions 62, a pair of lightly-doped extension regions 64, and a gate stack 66. The gate stack 66 comprises gate dielectric 68, and other materials 70 over the gate dielectric. Such other materials 70 may include conductive gate material, and insulative capping material over the conductive gate material.

A dielectric material 72 is provided outward of the first side 53 of the first semiconductor substrate 16, and the gate stacks 66 are within such dielectric material 72. The dielectric material 72 may comprise any suitable composition or combination of compositions; including, for example, one or more of silicon dioxide, silicon nitride, etc.

Another dielectric material 74 is outward of the dielectric material 72. The dielectric material 74 may comprise a same composition as dielectric material 72, or a different composition. Also, one or both of the dielectric materials 72 and 74 may comprise a same composition as the dielectric material 18, or may comprise a different composition relative to dielectric material 18.

A plurality of conductive segments 76 extend through the dielectric material 74. The conductive segments 76 may be electrically coupled with the first ends 51 of the through-wafer interconnects 50, and/or may be electrically coupled to a conductive gate material within gate stacks 66 through conductive interconnects 78, and/or may extend to other circuitry (not shown) associated with first assembly 12. The conductive structure 22 is electrically coupled with one of the conductive segments 76, and the first conductive pads 20 are also electrically coupled with the conductive segments 76. In the shown embodiment, one of the first conductive pads 20 is electrically coupled with a first end 51 of a through-wafer interconnect 50 through a conductive segment 76.

The first assembly 12 has a first surface 27 that extends across surfaces of the first conductive pads 20, conductive structure 22, and the first dielectric material 18.

The second assembly 14 comprises the second semiconductor substrate 24, the second dielectric material 26, and the second conductive pads 28.

In the shown embodiment, a plurality of the transistors 60 are supported by the second semiconductor substrate 24. At least some of the transistors 60 of the second assembly 14 may be substantially identical to at least some of the transistors 60 of the first assembly 12 in some embodiments, and at least some of the transistors 60 of the second assembly 14 may be different from at least some of the transistors 60 of the first assembly 12 in some embodiments.

A dielectric material 80 is provided outward of a first side 81 of the second semiconductor substrate 24, and the transistors 60 have gate stacks 66 within such dielectric material 80. The dielectric material 80 may comprise any suitable composition or combination of compositions; including, for example, one or more of silicon dioxide, silicon nitride, etc.

Another dielectric material 82 is outward of the dielectric material 80. The dielectric material 82 may comprise a same composition as the dielectric material 80, or a different composition. Also, one or both of the dielectric materials 80 and 82 may comprise a same composition as the dielectric material 26, or may comprise a different composition relative to the dielectric material 26.

A plurality of conductive segments 84 extend through the dielectric material 82. The conductive segments 84 may be electrically coupled to conductive gate material within gate stacks 66 through conductive interconnects 86 and/or may extend to other circuitry (not shown) associated with second assembly 14. The second conductive pads 28 are electrically coupled with the conductive segments 84.

The second assembly 14 has a second surface 29 that extends across surfaces of the second conductive pads 28 and the second dielectric material 26.

Figure 7:
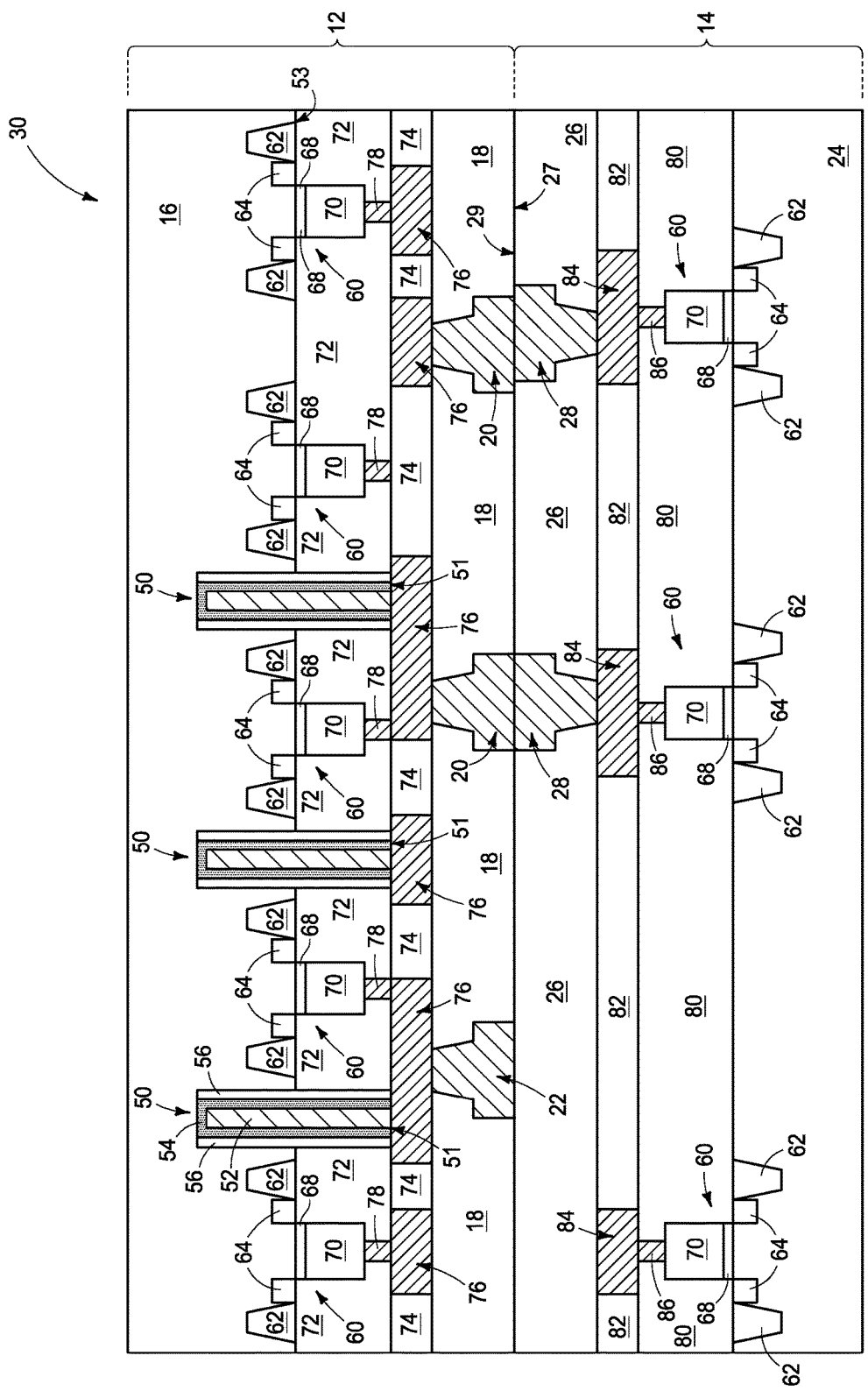
FIG. 7 is a cross-sectional side view showing the assemblies of FIG. 6 incorporated into a composite structure.

Referring to FIG. 7, the first surface 27 of first assembly 12 is placed directly against the second surface 29 of second assembly 14. The assemblies 12 and 14 are aligned so that surfaces of the first conductive pads 20 are directly against surfaces of the second conductive pads 28. It is noted that the alignment of the first and second conductive pads 20 and 28 need not be perfect. Accordingly, the right-most first and second conductive pads 20/28 are illustrated to be slightly misaligned to indicate that an adequate interface between the first and second conductive pads may be achieved even if the first and second conductive pads are slightly misaligned. Further, although the first and second conductive pads (20/28) are shown having a same shape as one another, in other embodiments the first conductive pads 20 may have a different shape (and possibly even a different surface area) than the second conductive pads 28.

The first and second assemblies 12/14 are joined into a composite structure 30 by bonding the surface of the first dielectric material 18 with the surface of the second dielectric material 26, and by bonding surfaces of the first conductive pads 20 with surfaces of the second conductive pads 28. The bonding of the first and second dielectric materials (18/26) may be accomplished through the above-described hybrid bonding whereby the dielectric materials 18 and 26 both comprise silicon dioxide, and covalent bonds are formed between the silicon dioxide of dielectric material 18 and the silicon dioxide of dielectric material 26. The bonding of the first and second conductive pads (20/28) may be accomplished utilizing the previously-discussed fusion of metal-containing materials from conductive pads 20 and 28. For instance, the conductive pads 20 and 28 may both comprise copper, and the copper from conductive pads 20 and may be fused with the copper from conductive pads 28 with the above-described thermal processing. The fusion of the metal-containing materials of conductive pads 20/28 may utilize higher-temperature thermal processing than the hybrid bonding of the dielectric materials 18/26, and in some embodiments such fusion may be conducted after the hybrid bonding. In other embodiments, the hybrid bonding may be conducted at a temperature suitable for at least some of the fusion to occur, and in such embodiments at least some of the fusion may be conducted during the hybrid bonding.

Is noted that the conductive structure 22 is capped by the second dielectric material 26 in the composite structure 30 of FIG. 7.

Figure 8:
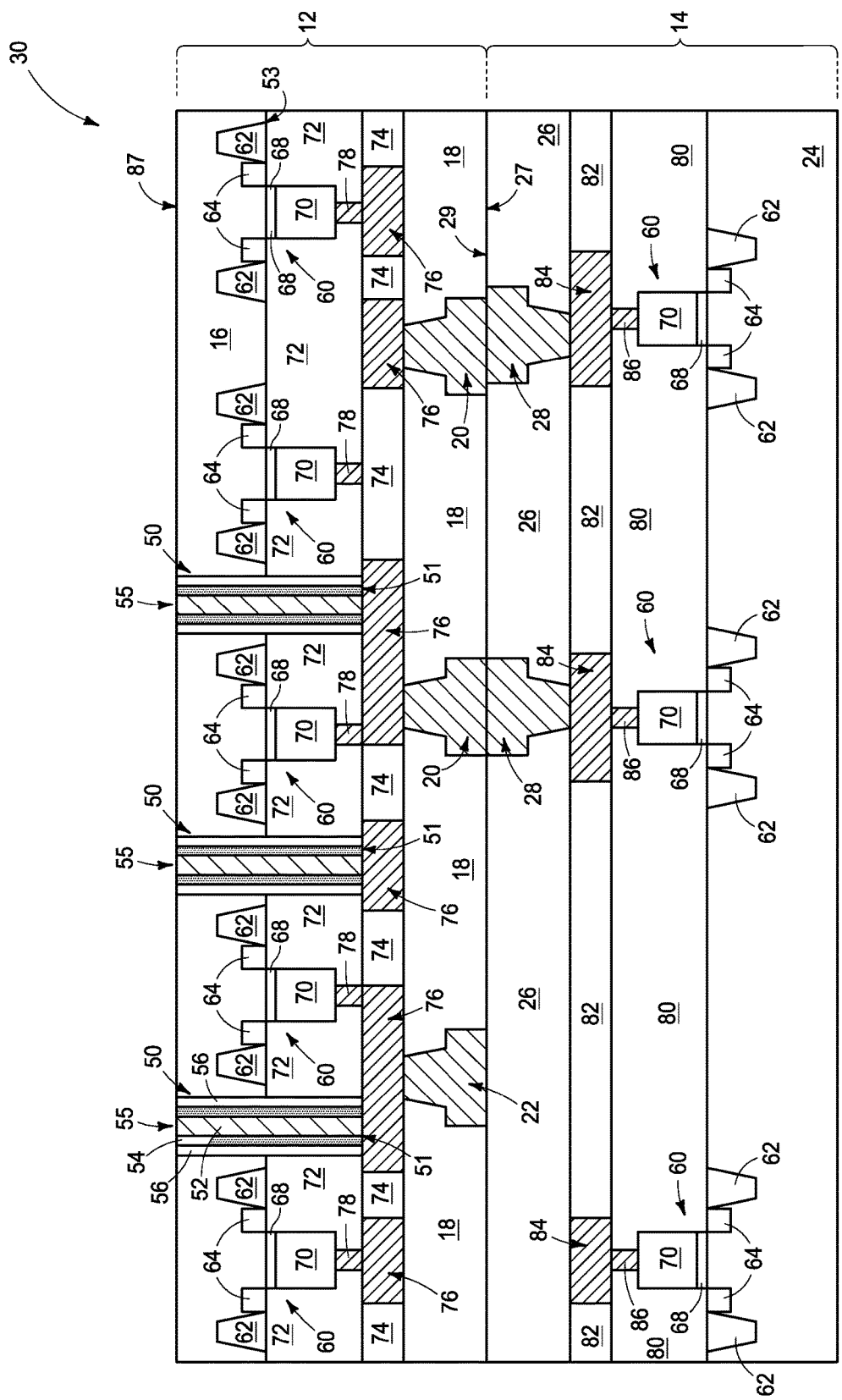
FIG. 8 is a cross-sectional side view showing the composite structure of FIG. 7 at an example processing stage subsequent to that of FIG. 7 in accordance with an example method.

Referring to FIG. 8, the first semiconductor substrate 16 is thinned (e.g. planarized) to expose second ends 55 of the through-wafer interconnects 50; with the second ends 55 being in opposing relation to the first ends 51 of the through-wafer interconnects. The thinning of the first semiconductor substrate 16 may remove some of the material of the interconnects 50, and forms a planarized surface 87 extending across semiconductor substrate 16 and interconnects 50.

Figure 9:
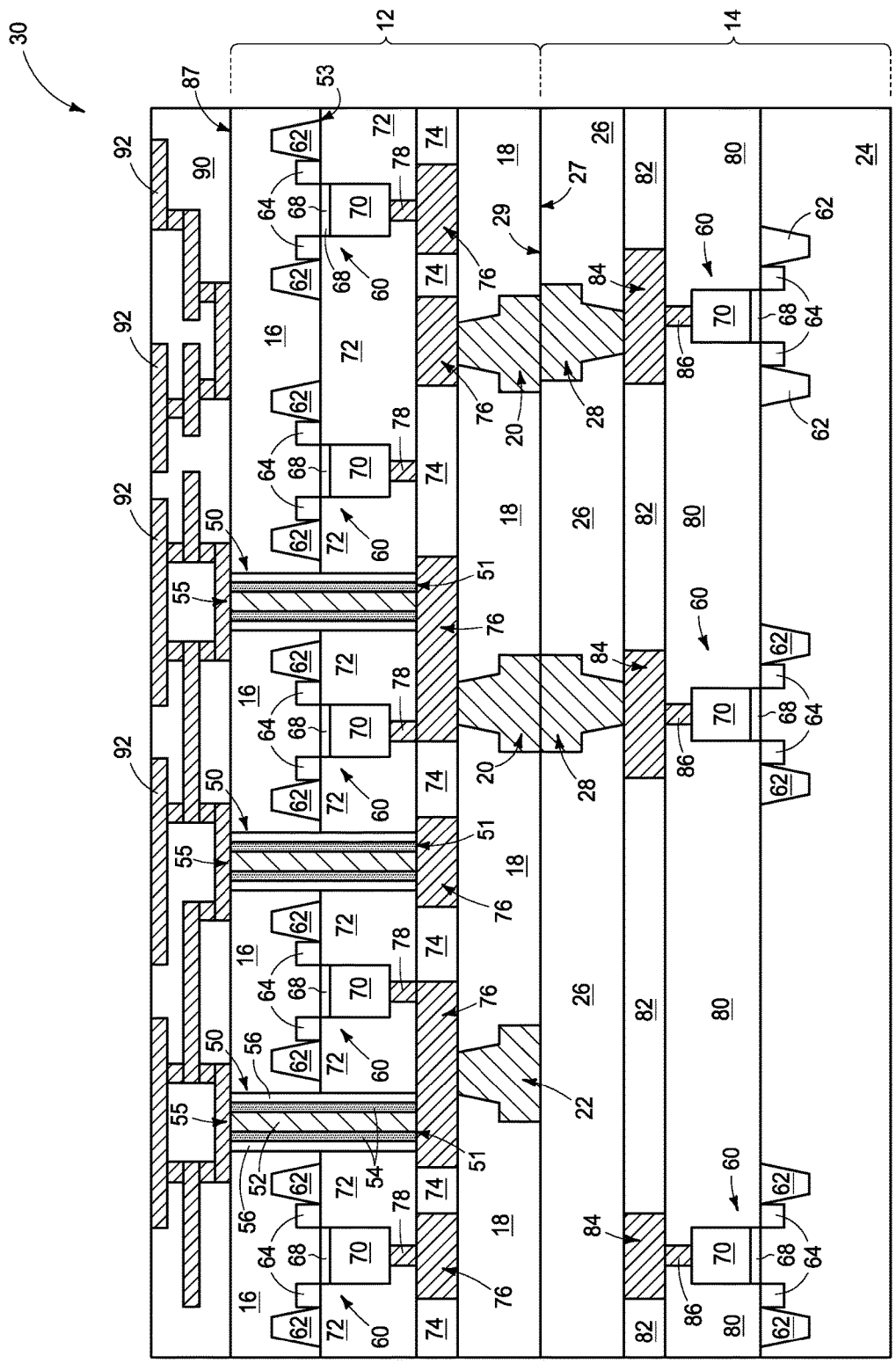
FIG. 9 is a cross-sectional side view showing the composite structure of FIG. 8 at an example processing stage subsequent to that of FIG. 8 in accordance with an example method.

Referring to FIG. 9, dielectric material 90 is formed across the planarized surface 87, and conductive redistribution material 92 is formed within the dielectric material 90 to form a multi-level redistribution layer. The dielectric material 90 may comprise any suitable composition or combination of compositions; including, for example, one or more of silicon dioxide, silicon nitride, etc. The conductive redistribution material 92 may comprise any suitable composition or combination of compositions; including, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The conductive redistribution material 92 may electrically couple the through-wafer interconnects with other circuitry (not shown) which may be associated with the composite structure 30, and/or which may be external to the composite structure 30.

Figure 10:
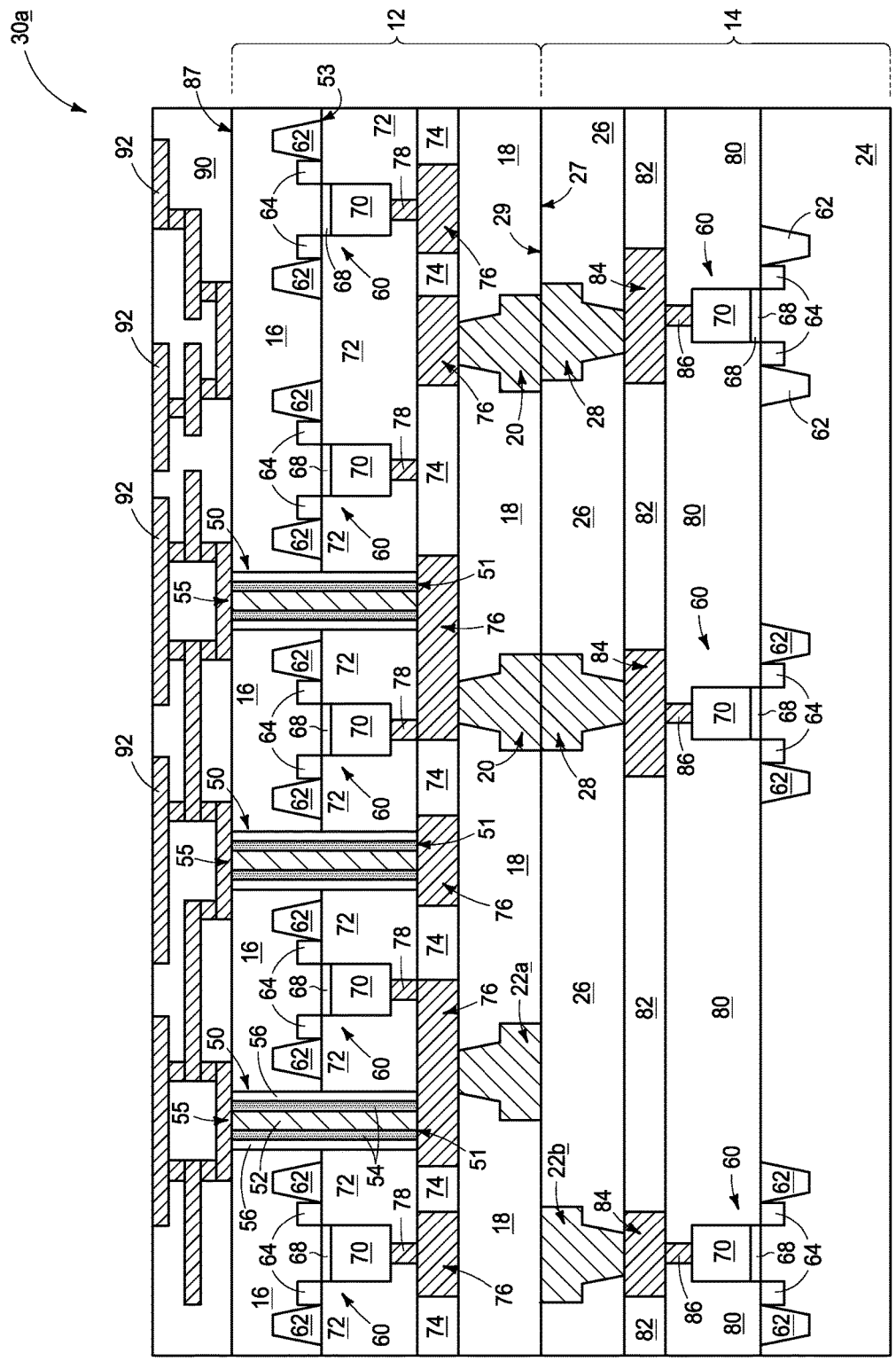
FIG. 10 is a cross-sectional side view showing an alternative composite structure to that of FIG. 9.

The composite structure 30 of FIG. 9 is an example of many different types of composite structures that may be formed with methodology described herein. FIG. 10 shows another example composite structure 30a. The composite structure 30a comprises two conductive structures 22a and 22b, with conductive structure 22a being part of assembly 12 and conductive structure 22b being part of assembly 14. In the composite structure 30a, the conductive structure 22a is capped by the second dielectric material 26 and the conductive structure 22b is capped by the first dielectric material 18. The conductive structures 22a and 22b may be any suitable structures associated with integrated circuitry. The conductive structures 22a and 22b may be similar to one another in some embodiments; and may, for example, be lines extending in and out of the page relative to the cross-section of FIG. 10. In other embodiments, the conductive structures 22a and 22b may not be similar to one another.

The conductive structures 22 and conductive pads 20/28 of FIGS. 6-10 are shaped like dual-damascene structures, but are illustrated to comprise a single homogeneous material. In other embodiments, the conductive structures 22 and conductive pads 20/28 may have other configurations. For instance, FIG. 11 shows a composite structure 30b in which a conductive structure 22 and conductive pads 20/28 are formed as dual-damascene structures having two different conductive materials 36 and 38 of the type described above with reference to FIGS. 4 and 5.

Figure 11:
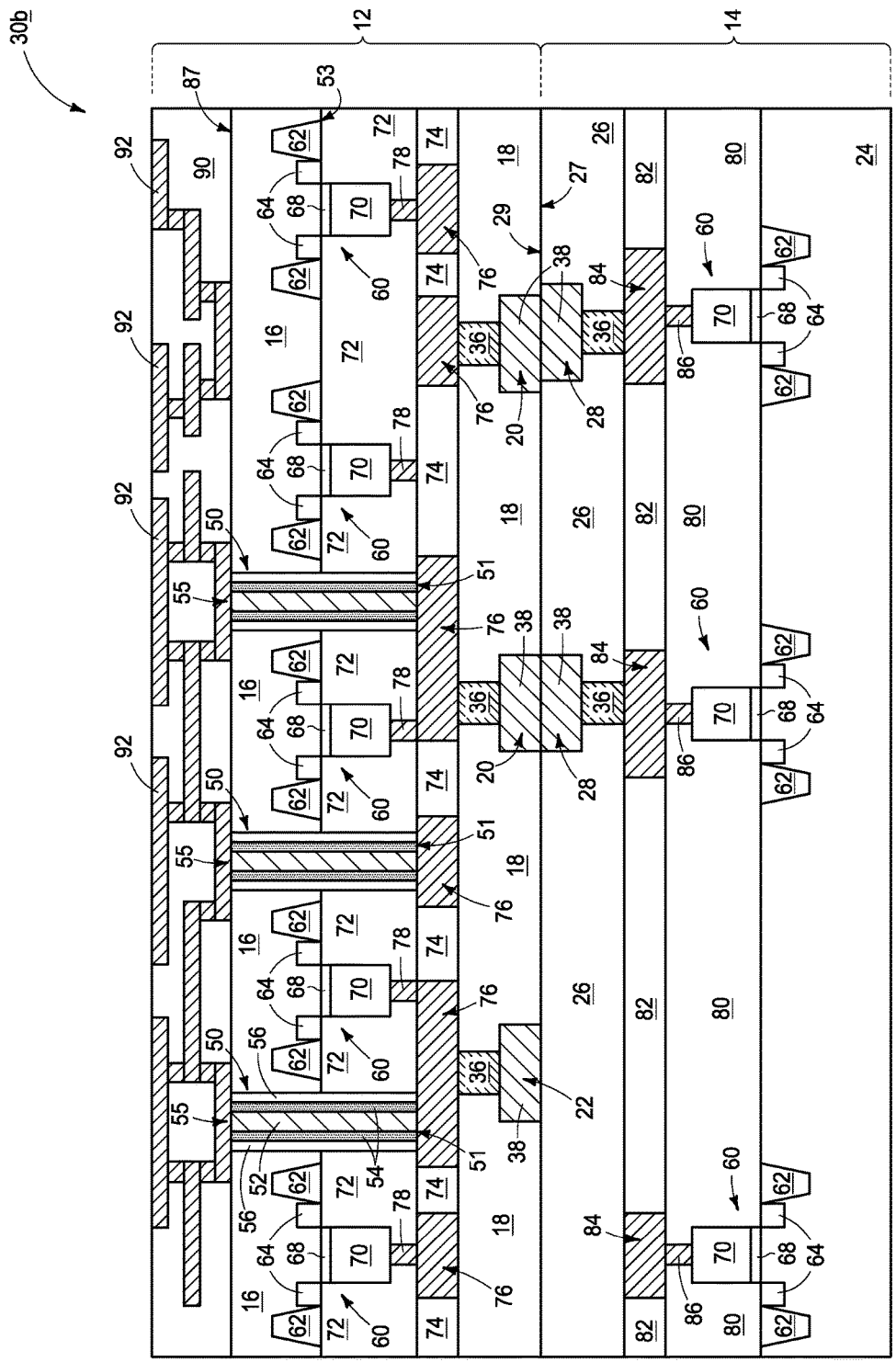
FIG. 11 is a cross-sectional side view showing an alternative composite structure to that of FIG. 9.
Figure 12:
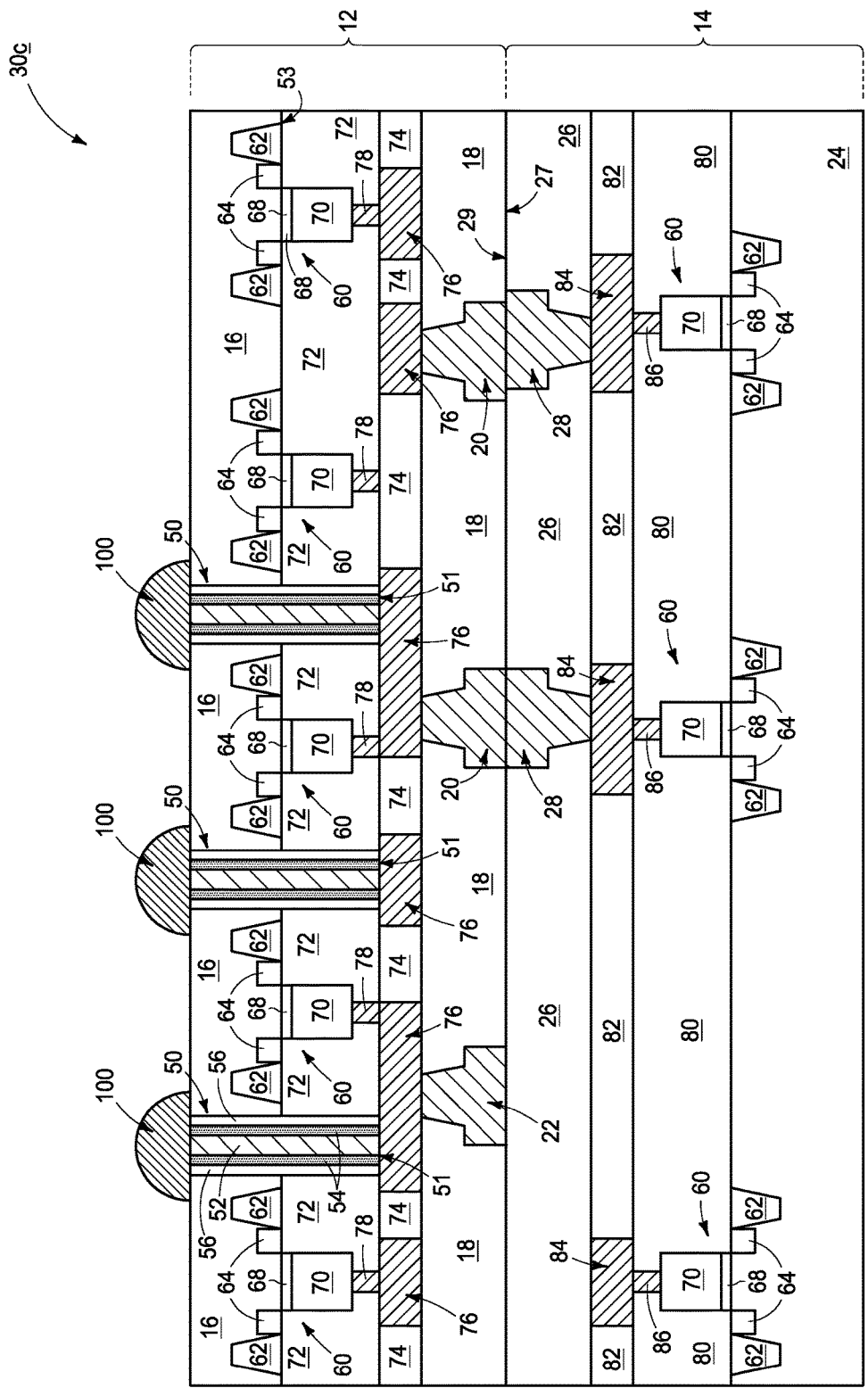
FIG. 12 is a cross-sectional side view showing the composite structure of FIG. 8 at an example processing stage subsequent to that of FIG. 8 in accordance with an example method.

The embodiments of FIGS. 9-11 utilize conductive redistribution material 92 across a back side surface 87 of the first semiconductor substrate 16. In other embodiments, other conductive structures may be utilized in addition to, or alternatively to, the conductive redistribution material. For instance, FIG. 12 shows a composite structure 30c which is analogous to the composite structure 30 of FIG. 9, but in which conductive bumps 100 are utilized instead of the conductive redistribution material 92 for the coupling of the through-wafer interconnects 50 with other circuitry (not shown). The conductive bumps may comprise any suitable compositions or combinations of compositions; including, for example, one or more of nickel, silver, gold, copper, solder, etc.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a method of forming integrated circuitry. A first dielectric material is formed over a first substrate. At least one first conductive pad and at least one conductive line are formed in the first dielectric material, and are spaced apart from each other. The first dielectric material, the at least one conductive pad and the at least one first conductive line include respective upper surfaces that are substantially coplanar with one another. A second dielectric material is formed over a second substrate. At least one second conductive pad is formed in the second dielectric material. The first and second dielectric materials are bonded to one another to form a hybrid-bonding structure. The at least one first conductive pad and the at least one second conductive pad are in contact with each other and the at least one conductive line is capped by the second dielectric material and electrically isolated from the at least one first conductive pad and the at least one second conductive pad.

Some embodiments include a method of forming integrated circuitry. A first assembly is formed to have a first semiconductor substrate supporting a first dielectric material, a first conductive pad and a conductive structure. The first assembly has a first surface which includes a surface of the first dielectric material, a surface of the first conductive pad and a surface of the conductive structure. A second assembly is formed to have a second semiconductor substrate supporting a second dielectric material and a second conductive pad. The second assembly has a second surface which includes a surface of the second dielectric material and a surface of the second conductive pad. The first and second dielectric materials comprise silicon dioxide, and the first and second conductive pads comprise copper. The first surface is placed directly against the second surface with the surface of the first dielectric material being directly against the surface of the second dielectric material, and with the surface of the first conductive pad being directly against the surface of the second conductive pad. The surface of the first dielectric material is bonded with the surface of the second dielectric material to form the first and second assemblies into a hybrid-bonding structure. The surface of the conductive structure is capped by the second dielectric material in the hybrid-bonding structure. After the hybrid-bonding structure is formed, the surface of the first conductive pad is bonded with the surface of the second conductive pad utilizing a thermal treatment.

Some embodiments include a method of forming integrated circuitry. A through-wafer interconnect is formed to extend into a first semiconductor substrate. A first end of the through-wafer interconnect is along a first side of the first semiconductor substrate, and a first dielectric material is formed outward of the first end of the through-wafer interconnect. A first conductive pad is formed within the first dielectric material and is electrically coupled with the first end of the trough-wafer interconnect. A conductive structure is formed within the first dielectric material and is spaced from the first conductive pad. The through-wafer interconnect, first semiconductor substrate, first dielectric material, conductive pad and conductive structure are comprised by a first assembly. The first assembly has a first surface that extends across surfaces of the first dielectric material, the conductive pad and the conductive structure. A second assembly is formed to have a second dielectric material supported by a second semiconductor substrate, and to have a second conductive pad within the second dielectric material. The second assembly has a second surface that extends across surfaces of the second conductive pad and the second dielectric material. The first surface is placed directly against the second surface with the surface of the first dielectric material being directly against the surface of the second dielectric material, and with the surface of the first conductive pad being directly against the surface of the second conductive pad. The first and second assemblies are joined into a composite structure by bonding the surface of the first dielectric material with the surface of the second dielectric material, and by bonding the surface of the first conductive pad with the surface of the second conductive pad. The conductive structure is capped by the second dielectric material in the composite structure. After the composite structure is formed, a second end of the through-wafer interconnect is exposed, with the second end of the through-wafer interconnect being in opposing relation to the first end of the through-wafer interconnect.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming integrated circuitry, comprising:
   forming a first dielectric material over a first substrate;
   forming in the first dielectric material at least one first conductive pad and at least one conductive line spaced apart from each other; the first dielectric material, the at least one conductive pad and the at least one first conductive line including respective upper surfaces that are substantially coplanar with one another;
   forming a second dielectric material over a second substrate;
   forming at least one second conductive pad in the second dielectric material; and
   bonding the first and second dielectric materials to one another to form a hybrid-bonding structure, wherein the at least one first conductive pad and the at least one second conductive pad are in contact with each other and the at least one conductive line is capped by the second dielectric material and electrically isolated from the at least one first conductive pad and the at least one second conductive pad.

2. The method of claim 1 further comprising performing a thermal treatment to bond the at least one first conductive pad with the at least one second conductive pad after forming the hybrid-bonding structure.

3. The method of claim 1 further comprising forming at least one second conductive line in the second dielectric material; the second conductive line being spaced from the at least one second conductive pad; and wherein the at least one second conductive line is capped by the first dielectric material in the hybrid-bonding structure.

4. The method of claim 1 further comprising forming the at least one first conductive pad utilizing dual-damascene methodology, and forming the at least one second conductive pad utilizing dual-damascene methodology.

5. The method of claim 1 wherein the at least one first conductive pad comprises a single homogeneous metal-containing composition, and wherein the at least one second conductive pad comprises a same single homogeneous metal-containing composition as the at least one first conductive pad.

6. The method of claim 1 wherein the at least one first conductive pad comprises copper, and wherein the at least one second conductive pad comprises copper.

7. The method of claim 1 wherein the first and second dielectric materials comprise silicon dioxide.

8. A method of forming integrated circuitry, comprising:
forming a first assembly having a first semiconductor substrate supporting a first dielectric material, a first conductive pad and a conductive structure; the first assembly having a first surface which includes a surface of the first dielectric material, a surface of the first conductive pad and a surface of the conductive structure;
forming a second assembly having a second semiconductor substrate supporting a second dielectric material and a second conductive pad; the second assembly having a second surface which includes a surface of the second dielectric material and a surface of the second conductive pad; wherein the first and second dielectric materials comprise silicon dioxide, and wherein the first and second conductive pads comprise copper;
placing the first surface directly against the second surface with the surface of the first dielectric material being directly against the surface of the second dielectric material, and with the surface of the first conductive pad being directly against the surface of the second conductive pad;
bonding the surface of the first dielectric material with the surface of the second dielectric material to form the first and second assemblies into a hybrid-bonding structure; the surface of the conductive structure being capped by the second dielectric material in the hybrid-bonding structure; and
after forming the hybrid-bonding structure, bonding the surface of the first conductive pad with the surface of the second conductive pad utilizing a thermal treatment.

9. The method of claim 8 wherein the conductive structure is a conductive line.

10. The method of claim 8 wherein the conductive structure is a first conductive structure; wherein the second assembly includes a second conductive structure; wherein the second surface includes a surface of the second conductive structure; and wherein the surface of the second conductive structure is capped by the first dielectric material in the hybrid-bonding structure.

11. The method of claim 10 wherein the first and second conductive structures are conductive lines.

12. A method of forming integrated circuitry, comprising:
forming a through-wafer interconnect extending into a first semiconductor substrate; a first end of the through-wafer interconnect being along a first side of the first semiconductor substrate;
forming a first dielectric material outward of the first end of the through-wafer interconnect;
forming a first conductive pad within the first dielectric material and electrically coupled with the first end of the trough-wafer interconnect, and forming a conductive structure within the first dielectric material and spaced from the first conductive pad; the through-wafer interconnect, first semiconductor substrate, first dielectric material, conductive pad and conductive structure being comprised by a first assembly; the first assembly having a first surface that extends across surfaces of the first dielectric material, the conductive pad and the conductive structure;
forming a second assembly to have a second dielectric material supported by a second semiconductor substrate, and to have a second conductive pad within the second dielectric material; the second assembly having a second surface that extends across surfaces of the second conductive pad and the second dielectric material;
placing the first surface directly against the second surface with the surface of the first dielectric material being directly against the surface of the second dielectric material, and with the surface of the first conductive pad being directly against the surface of the second conductive pad;
joining the first and second assemblies into a composite structure by bonding the surface of the first dielectric material with the surface of the second dielectric material, and by bonding the surface of the first conductive pad with the surface of the second conductive pad; the conductive structure being capped by the second dielectric material in the composite structure; and
after forming the composite structure, exposing a second end of the through-wafer interconnect, with the second end of the through-wafer interconnect being in opposing relation to the first end of the through-wafer interconnect.

13. The method of claim 12 wherein the conductive structure is a conductive line.

14. The method of claim 12 wherein the bonding of the surface of the first conductive pad with the surface of the second conductive pad occurs after at least some of the bonding of the surface of the first dielectric material with the surface of the second dielectric material.

15. The method of claim 12 wherein the first and second dielectric materials comprise silicon dioxide.

16. The method of claim 15 wherein the bonding of the surface of the first dielectric material with the surface of the second dielectric material comprises plasma treatment of one or both of the surfaces of the first and second dielectric materials, followed by thermal treatment utilizing a temperature within a range of from about 150° C. to about 200° C.

17. The method of claim 16 wherein the first and second conductive pads comprise copper.

18. The method of claim 17 wherein the bonding of the surface of the second conductive pad with the surface of the first conductive pad comprises thermal treatment utilizing a temperature within a range of from about 300° C. to about 400° C., and follows the bonding of the surface of the first dielectric material with the surface of the second dielectric material.

19. The method of claim 12 wherein the conductive structure is a first conductive structure; wherein the second assembly includes a second conductive structure; wherein the second surface includes a surface of the second conductive structure; and wherein the surface of the second conductive structure is capped by the first dielectric material in the composite structure.

20. The method of claim 12 further comprising forming redistribution wiring in contact with the exposed second end of the through-wafer interconnect.

21. The method of claim 12 further comprising forming a conductive bump in contact with the exposed second end of the through-wafer interconnect.

* * * * *

UNITED STATES PATENT AND TRADEMARK OFFICE
CERTIFICATE OF CORRECTION

Page 1 of 1

PATENT NO. : 9,666,573 B1
APPLICATION NO. : 15/335259
DATED : May 30, 2017
INVENTOR(S) : Mitsunari Sukekawa It is certified that error appears in the above-identified patent and that said Letters Patent is hereby corrected as shown below:

In the Claims

Column 13, Line 53 – Replace "trough-wafer" with --through-wafer--

Signed and Sealed this
Thirteenth Day of February, 2018

Andrei Iancu
*Director of the United States Patent and Trademark Office*